(12) United States Patent
Parolini et al.

(10) Patent No.: US 10,087,519 B1
(45) Date of Patent: Oct. 2, 2018

(54) PREFORM AND METHOD OF MAKING A PREFORM

(71) Applicant: GENERAL ELECTRIC COMPANY, Schenectady, NY (US)

(72) Inventors: Jason Robert Parolini, Greer, SC (US); John McConnell Delvaux, Fountain Inn, SC (US); Srikanth Chandrudu Kottilingam, Greenville, SC (US); James Joseph Murray, Piedmont, SC (US); Canan Uslu Hardwicke, Greenville, SC (US); Matthew Troy Hafner, Honea Path, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/629,532

(22) Filed: Jun. 21, 2017

(51) Int. Cl.
```
B01J 19/08      (2006.01)
B01J 19/10      (2006.01)
B06B 1/00       (2006.01)
C23C 16/04      (2006.01)
C23C 16/24      (2006.01)
```
(52) U.S. Cl.
CPC .......... *C23C 16/045* (2013.01); *C23C 16/24* (2013.01)

(58) Field of Classification Search
CPC ... C04B 35/573; C04B 35/806; C23C 16/045; C23C 16/24
See application file for complete search history.

(56) References Cited

U.S. PATENT DOCUMENTS

| | | | |
|---|---|---|---|
| 5,612,264 A | 3/1997 | Bullock et al. | |
| 5,840,221 A | 11/1998 | Lau et al. | |
| 6,024,898 A * | 2/2000 | Steibel | C04B 35/806 264/29.1 |
| 7,681,625 B2 * | 3/2010 | Gordon | C22C 47/064 164/461 |
| 7,708,851 B2 | 5/2010 | Corman et al. | |
| 9,234,430 B2 | 1/2016 | Cairo et al. | |
| 2012/0184184 A1 | 7/2012 | Grosbois et al. | |
| 2015/0316027 A1 | 11/2015 | Sandercock | |

FOREIGN PATENT DOCUMENTS

CN  103951469 A  7/2014

* cited by examiner

*Primary Examiner* — Michael P Wieczorek
(74) *Attorney, Agent, or Firm* — McNees Wallace & Nurick LLC

(57) ABSTRACT

A method of making a preform and preform formed by the method. The method includes providing a first pre-preg ply including at least a first fiber and a first resin. The method also includes providing a second pre-preg ply including at least a second fiber and a second resin over at least a portion of the first pre-preg ply. Heat or electromagnetic radiation is used to at least partially cure the first and second resins to form a cured preform. Heat is applied to pyrolyze at least a portion of the resin of the cured preform to form a pyrolyzed preform. A mechanical stimulus including at least one of controlled drying, local explosions, or ultrasonic energy is applied to the pyrolyzed preform. The mechanically treated pyrolyzed preform is subsequently densified by melt infiltration to form a densified preform.

18 Claims, 6 Drawing Sheets

PREFORM AND METHOD OF MAKING A PREFORM

FIELD OF THE INVENTION

The present invention is directed to methods of manufacturing ceramic matrix composites. More particularly, the present invention is directed to techniques for increasing the matrix infiltration into the ceramic matrix composite.

BACKGROUND OF THE INVENTION

Ceramic matrix composites are increasingly employed in harsh environments. Environments such as gas turbines subject the ceramic matrix composite to intense heat and pressures resulting in mechanical and thermal stresses which can shorten the service life of the composite. A ceramic matrix composite exhibiting improved durability to harsh operating environments in comparison to the prior art would be desirable in the art.

BRIEF DESCRIPTION OF THE INVENTION

In an exemplary embodiment, a method of making a preform, including, providing a first pre-preg ply including at least a first fiber and a first resin. The method also includes providing a second pre-preg ply including at least a second fiber and a second resin over at least a portion of the first ply. The method also includes applying heat or electromagnetic radiation to at least partially cure the first and second resins to form a cured preform. The method also includes applying heat to pyrolyze at least a portion of the resin from the cured preform to form a pyrolyzed preform. A mechanical stimulus including at least one of controlled drying, local explosions, shaking, vibration, or ultrasonic energy is applied to the pyrolyzed preform to form a mechanically treated pyrolyzed preform. The mechanically treated pyrolyzed preform is densified with an infiltration material to form a densified preform.

In an exemplary embodiment, a method of making a preform, including providing a first ply including at least a first fiber. A second ply including at least a second fiber is provided over at least a portion of the first ply. The first ply and the second ply are impregnated with at least one resin. The method also includes applying heat or electromagnetic radiation to at least partially cure the first and second resins to form a cured preform. The method further includes applying heat to pyrolyze at least a portion of the resin from the cured preform to form a pyrolyzed preform. A mechanical stimulus including at least one of controlled drying, local explosions, shaking, vibration, or ultrasonic energy is applied to the pyrolyzed preform to form a mechanically treated pyrolyzed preform. The mechanically treated pyrolyzed preform is densified with an infiltration material to form a densified preform.

In an exemplary embodiment, a preform is manufactured by the method described above.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided is a method of forming a preform. Embodiments of the present disclosure, for example, in comparison to the concepts failing to include one or more features disclosed herein, result in a preform having improved matrix infiltration and ceramic uniformity.

Figure 1:
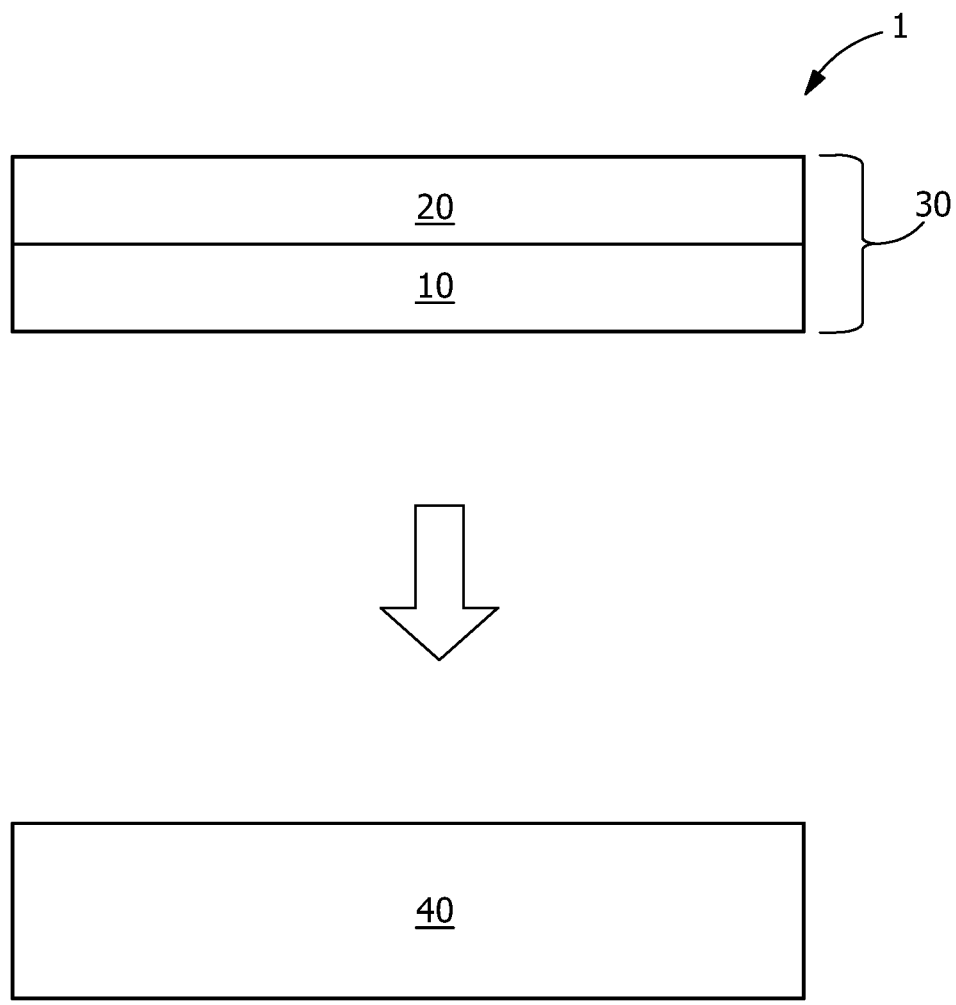
FIG. 1 is a schematic diagram of a preform according to an embodiment.

An embodiment of a preform 1 is shown in FIG. 1. In an exemplary embodiment, the preform 1 includes a first ply 10 including at least a first fiber. A second ply 20 including at least a second fiber may be provided over the first ply 10. In some embodiments, the second ply 20 may be co-extensive with the first ply 10. In some embodiments, additional plies may be provided to the preform 1. In some embodiments, the preform may include a dry layup. In some embodiments, the preform may include a wet layup. In an embodiment, one or more plies of the preform may be pre-impregnated with at least one resin (e.g., a pre-preg).

The first fiber and/or second fiber may be provided in various fibrous forms including unidirectional (e.g., unidirectional filaments, unidirectional tows, unidirectional rovings, and combinations thereof), woven (e.g., plain weave, satin weave, twill weave, basket weave, two dimensional weave, three dimensional weave, and combinations thereof), knit (e.g, warp knit, weft knit, and combinations thereof), nonwoven (e.g., felt), and combinations thereof. In an embodiment, the first fiber and second fiber are provided in a three dimensional weave mechanically connecting the first ply 10 to the second ply 20. In an embodiment, the first fiber and second fiber are provided as unidirectional fibers.

The fibers of the first ply 10, the fibers of the second ply 20, and, if present, the fibers of additional plies may be aligned in the same or different directions (e.g., 0 degrees, 30 degrees, 45 degrees, 60 degrees, 90 degrees, −30 degrees, −45 degrees, −60 degrees, and combinations thereof). In an embodiment, the preform 1 includes plies aligned at 0 degrees, −45 degrees, 45 degrees, and 90 degrees.

One or more resins may be added to the preform 1 in order to improve the mechanical handling of the preform 1. In some embodiments, the one or more resins may be added prior to layup (e.g., pre-preg). In some embodiments, the one or more resins may be added during layup (e.g., spray coating, sprayup, and/or coated rollers). In some embodiments, the one or more resins may be added after layup (e.g., resin transfer molding, vacuum assisted resin transfer molding, reaction injection molding, compression molding, and/or resin film infusion).

Figure 2:
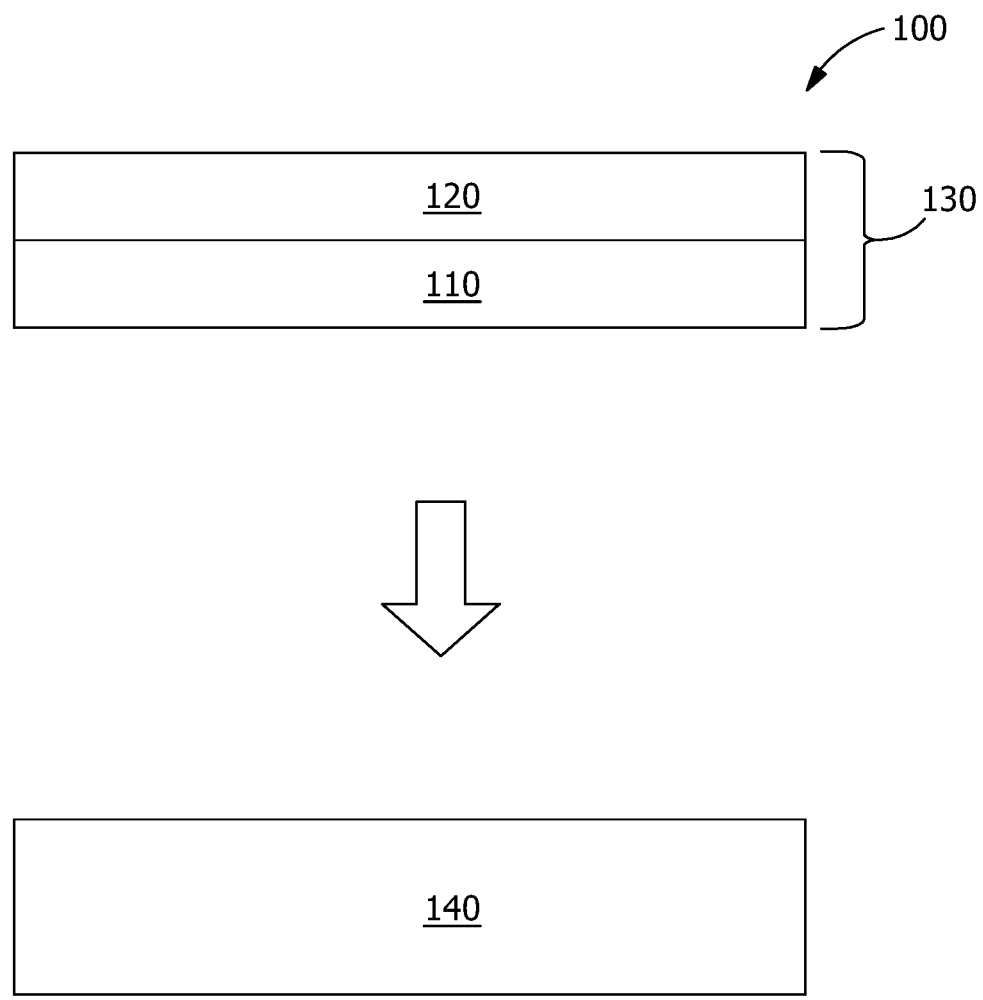
FIG. 2 is a schematic diagram of a preform according to an embodiment.

In an exemplary embodiment, one or more plies of the preform 1 may be pre-impregnated with at least one resin prior to layup (e.g., a pre-preg). In the example of FIG. 2, a pre-impregnated preform 100 includes a first pre-preg ply 110 including the first fiber and a first resin. A second pre-preg ply 120 including the second fiber and a second resin may be provided over the first pre-preg ply 110. In some embodiments, the second pre-preg ply 120 may be co-extensive with the first pre-preg ply 110. In some embodiments, additional plies may be provided to the preform 100. In some embodiments, the additional plies may be pre-impregnated with resin. In some embodiments, the additional plies may be essentially resin free. In some embodiments, the additional plies may include a combination of pre-impregnated plies and essentially resin free plies.

Suitable fibers include any fibers exhibiting suitable thermal and mechanical properties at the desired processing and operating conditions. Suitable fibers include but are not limited to ceramic fibers (e.g., mullite, silicon carbide, silicon nitride, alumina, aluminum nitride, titanium boride, titanium nitride, titanium carbide, boron carbide, and combinations thereof). In some embodiments, the first fiber may be the same or different from the second fiber. In one embodiment, the first fiber is the same as the second fiber. In some embodiments, the first fiber and/or the second fiber may exhibit an operating temperature above 1200 degrees Celsius and/or a melting temperature above 1700 degrees Celsius.

In some embodiments, one or more fibers may including one or more coatings. In an embodiment, the one or more coated fibers includes a boron nitride coating. In one embodiment, the one or more coated fibers includes a silicon doped boron nitride coating. In an embodiment, the one or more fibers includes a silicon nitride coating. In an embodiment, the one or more fibers includes a carbon coating. In one embodiment, the one or more coated fibers includes a boron nitride or silicon doped boron nitride coating and a silicon nitride overcoating. In one embodiment, the one or more coated fibers includes a boron nitride or silicon doped boron nitride coating, a silicon nitride coating, and at least one carbon coating. In one embodiment, the one or more coated fibers includes a boron nitride or silicon doped boron nitride coating, a carbon coating, a silicon nitride coating, and a carbon overcoating. In some embodiments, the one or more coatings may be deposited by chemical vapor deposition.

Suitable resins include any resins compatible with the fibers. Suitable resins include but are not limited to thermoplastic resins (e.g., polyethylene, polypropylene, polyvinyl chloride, polycarbonate, and/or ethylene copolymers), thermoset resins (e.g., polyurethane, phenolic, furanic, bismaleimide, polyimide, polyester, melamine and/or polycyanurate), and combinations thereof. In some embodiments, the resin includes a furanic resin, such as a furanic alcohol resin (e.g., furfuryl alcohol). In one embodiment, the furanic resin may be used in combination with a phenolic resin (e.g., phenol formaldehyde). In some embodiments, the first resin may be the same or different from the second resin. In one embodiment, the first resin is the same as the second resin.

The resin may optionally contain one or more additives. In some embodiments, the additive includes particles having an elemental component of the fiber (e.g., silicon carbide, carbon). In some embodiments, the additive includes materials that increase the porosity of the resulting matrix (e.g., plasticizers (e.g., BUTVAR, alcohols, inorganic polymers, pressurized gas, salts). In some embodiment, the additives include silicon carbide powder and carbon powder. In some embodiments, the combined amount of silicon carbide powder and carbon power may be about 20 weight percent to about 50 weight percent of the total weight of resin.

As the resins solidify and/or cure the plies of the preform 1 are bonded together to form a cured preform 30. In some embodiments, the resins may be at least partially cured by heating (e.g., microwave and/or thermal) and/or by the application of electromagnetic radiation (e.g. visible light, and/or ultraviolet light) and/or by charged particle bombardment (e.g., electron beam) alone or in combination with increased pressure (e.g., autoclave). In some embodiments, the resins may be substantially fully cured. Substantially fully curing the resin may allow for the cured preform 30 to be more easily physically manipulated during processing without damage.

The cured preform 30 may be pyrolyzed to convert at least a portion of the resinous material of the preform 1 into carbon to form a pyrolyzed preform 40. The carbon forms a porous matrix which typically retains the shape of the preform 1. In some embodiments, substantially all the resinous material is pyrolyzed during formation of the pyrolyzed preform 40.

Figure 3:
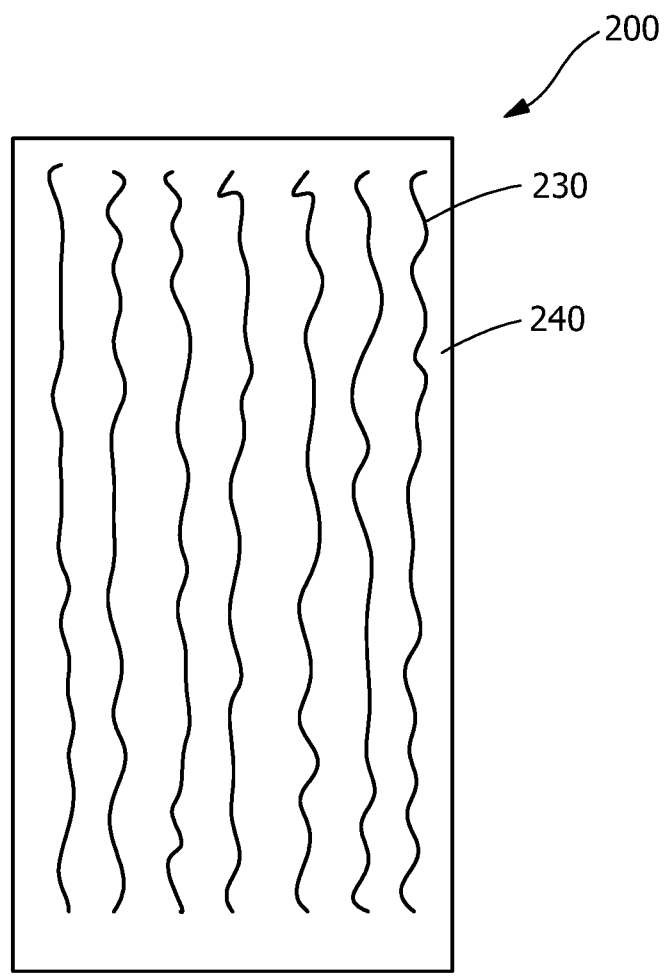
FIG. 3 is a schematic diagram of a pyrolyzed preform, according to an embodiment.

The pyrolyzed preform 40 may be densified to form a densified preform 200, as shown in FIG. 3. Densification may enhance the mechanical, optical, and/or electrical properties of the densified preform 200 (e.g. hardness, fracture toughness, bending strength, abrasion resistance, thermal expansion, thermal conductivity, thermal shock resistance, thermal shock cycling). The pyrolyzed preform 40 may be infiltrated with a matrix 240 (e.g., ceramic) or matrix precursor materials (e.g., molten silicon) to form the densified preform 200. In the example of FIG. 3, the densified preform 200 includes the fibrous reinforcement 230 and the matrix 240. During densification the materials of the matrix 240 infiltrate the fibrous structure of the plies of the pyrolyzed preform 40 forming the densified preform 200. Suitable infiltration materials include but are not limited to carbon, mullite, silicon carbide, silicon nitride, molten silicon, alumina, aluminum nitride, titanium boride, titanium nitride, titanium carbide, boron carbide, and combinations thereof. In some embodiments, the infiltration material includes the same materials as the fibers of at least one ply. In one embodiment, the fibers of the plies are the same and the infiltration materials include the same materials as the fibers of the plies. During densification the temperature of the preform 1 is typically elevated above the decomposition temperature of any resins remaining after pyrolyzation allowing substantially all of the resins to be removed from the pyrolyzed preform 40 during densification.

Densification may be performed by various techniques (e.g., chemical vapor infiltration, polymer infiltration and pyrolysis, melt infiltration, slurry infiltration, liquid silicon infiltration, sintering, electrophoretic deposition, solution infiltration, pre-ceramic powder ceramic precursor pyrolysis, polymer precursor pyrolysis, and combinations thereof). In some embodiments, the densification includes melt infiltration. In an embodiment, the densification includes a combination of chemical vapor infiltration and melt infiltration.

Figure 4:
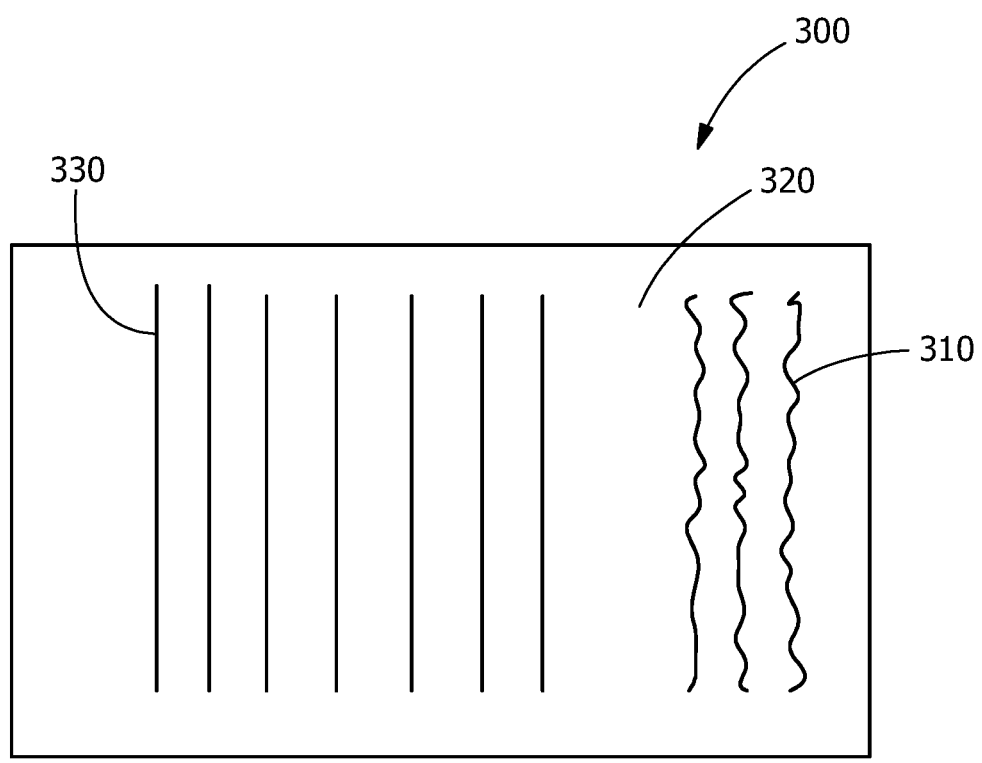
FIG. 4 is schematic diagram of a mechanically treated preform according to an embodiment.

A mechanical stimulus (e.g., controlled drying, local explosions, and/or ultrasonic energy) may be applied to the pyrolyzed preform 40 to improve the penetration of the infiltration material (e.g., vapor, melt infiltrant) into the internal regions of the pyrolyzed preform 40. An example embodiment of a mechanically treated preform 300 is shown in FIG. 4. Without being bound by any theory it is believed that the application of mechanical stimulus allows the formation of small fissures 310 in a carbon matrix 320. In some embodiment, the fissures 310 may be substantially uniformly distributed throughout the carbon matrix 320. In some embodiments, the density of the fissures 310 may be greater internal to the carbon matrix 320 compared to the surface region of the carbon matrix 310. In some embodiments, the density of the fissures 310 is greater within the plies as compared to between the plies. The fissures 310 may act as pathways that allow the melt infiltrant (e.g., molten silicon) to penetrate more uniformly into the carbon matrix 320 forming a more uniform silicon carbide matrix 240 which allows reinforcing fibers 330 to provide improved mechanical properties (e.g., fracture toughness) in the resulting densified preform 200. In some embodiments, the small fissures 310 may also aid in off-gassing during densification. In some embodiments, the fissures may exhibit an average aspect ratio, length to diameter, of at least 7, at least 10, and/or at least 15. In some embodiments, the resulting densified preform 200 exhibits a density of greater than 90 percent, greater than 95 percent, greater than 98 percent, greater than 99 percent, greater than 99.5 percent, greater than 99.8 percent, and/or greater than 99.9 percent of the theoretical maximum density.

In an example embodiment, the mechanical stimulus may include ultrasonic energy. In some embodiments, the frequency of the ultrasonic energy may be at least 100 hertz. In some embodiments, the frequency of the ultrasonic energy may be at least 10 kilohertz. In an embodiment, the ultrasonic energy may be in the form of sinusoidal waves. In order to transfer energy more efficiently from the applied wave to the preform 40 the distance from the wave source to a target region may be adjusted to a wave peak. The location of wave peaks may be expressed by the equation $d=n(\lambda)/4$, where d is the distance from the wave source to the target, $\lambda$ is the wavelength and n is an odd integer (e.g., 1, 3, 5, 7, 9, ... ).

A chemical treatment may be applied to the pyrolyzed preform 40 in combination with the mechanical stimulus to further improve the penetration of the infiltration material. The chemical treatment may facilitate the removal of a portion of the pyrolyzed material forming enlarged and/or additional fissures in the pyrolyzed preform 40. In some embodiments, chemical treatment may be applied during the application of the mechanical stimulus. In some embodiments, the chemical treatment may be applied after the application of the mechanical stimulus.

In an example embodiment, a pyrolyzed preform 40 including silicon carbide fibers in the first ply 10 and the second ply 20 may be subjected to chemical vapor infiltration. A first infiltration material, such as, a hydrocarbon (e.g., methane, ethane, propane, and combinations thereof) under an inert atmosphere (e.g., argon) is contacted with the silicon carbide fibers at pyrolytic temperatures (e.g., above 1000 degrees Celsius). The hydrocarbon undergoes pyrolysis resulting in the deposition of a carbon matrix.

The carbon infiltrated pyrolyzed preform 40 may be further infiltrated by melt infiltration to form the preform 200. A second infiltration material, such as, a composition comprising molten silicon (e.g., above 1414 degrees Celsius) is contacted with the carbon infiltrated pyrolyzed preform 40 under an inert atmosphere (e.g., argon). The molten silicon reacts with the carbon matrix to form silicon carbide in-situ resulting in the formation of a silicon carbide matrix 240 and the densified preform 200.

In an example embodiment, a pyrolyzed preform 40 including silicon carbide fibers in the first ply 10 and the second ply 20 may be subjected to melt infiltration to form the densified preform 200. An infiltration material, such as, a composition comprising molten silicon (e.g., above 1414 degrees Celsius) is contacted with the pyrolyzed preform 40 under an inert atmosphere (e.g., argon). The molten silicon reacts with the carbon matrix to form silicon carbide in-situ resulting in the formation of a silicon carbide matrix 240 and the densified preform 200.

Figure 5:
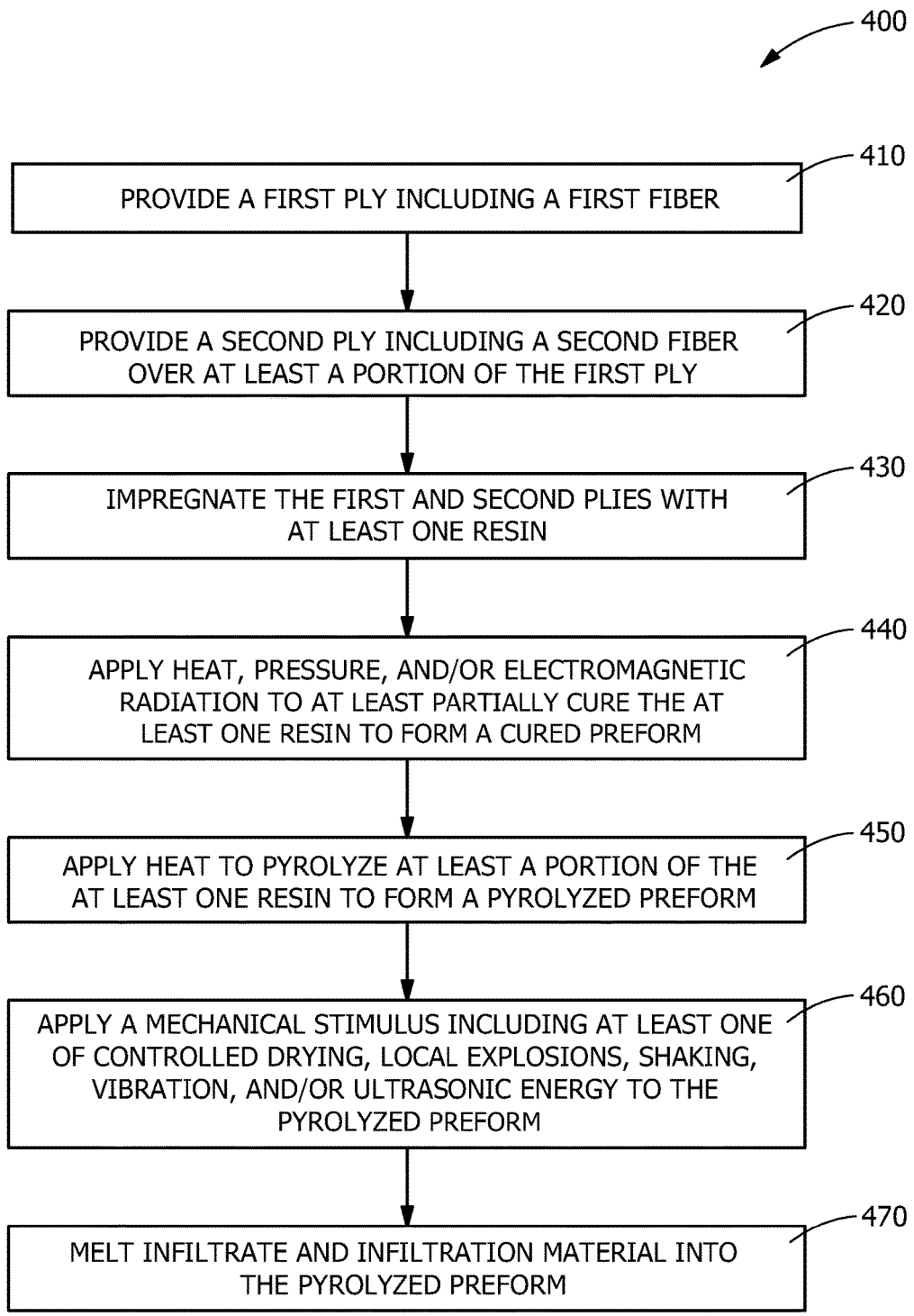
FIG. 5 is a flowchart of a method of making a preform according to an embodiment.

FIG. 5 is a flowchart of a method 400 of making the preform 200. In the example of FIG. 5, at block 410, a first ply 10 including a first fiber is provided. At block 420, a second ply 20 including a second fiber is provided over at least a portion of the first ply 10. At block 430, at least one resin is impregnated into the first ply 10 and the second ply 20. At block 440, heat, pressure, and/or electromagnetic radiation is applied to at least partially cure the at least one resin to form a cured preform 30. At block 450, heat is applied to pyrolyze at least a portion of the at least one resin to form a pyrolyzed preform 40. At block 460, a mechanical stimulus including at least one of controlled drying, local explosions, shaking, vibration, and/or ultrasonic energy is applied to the pyrolyzed preform 40. At block 470, an infiltration material is melt infiltrated into the pyrolyzed preform 40 to form the preform 200.

Figure 6:
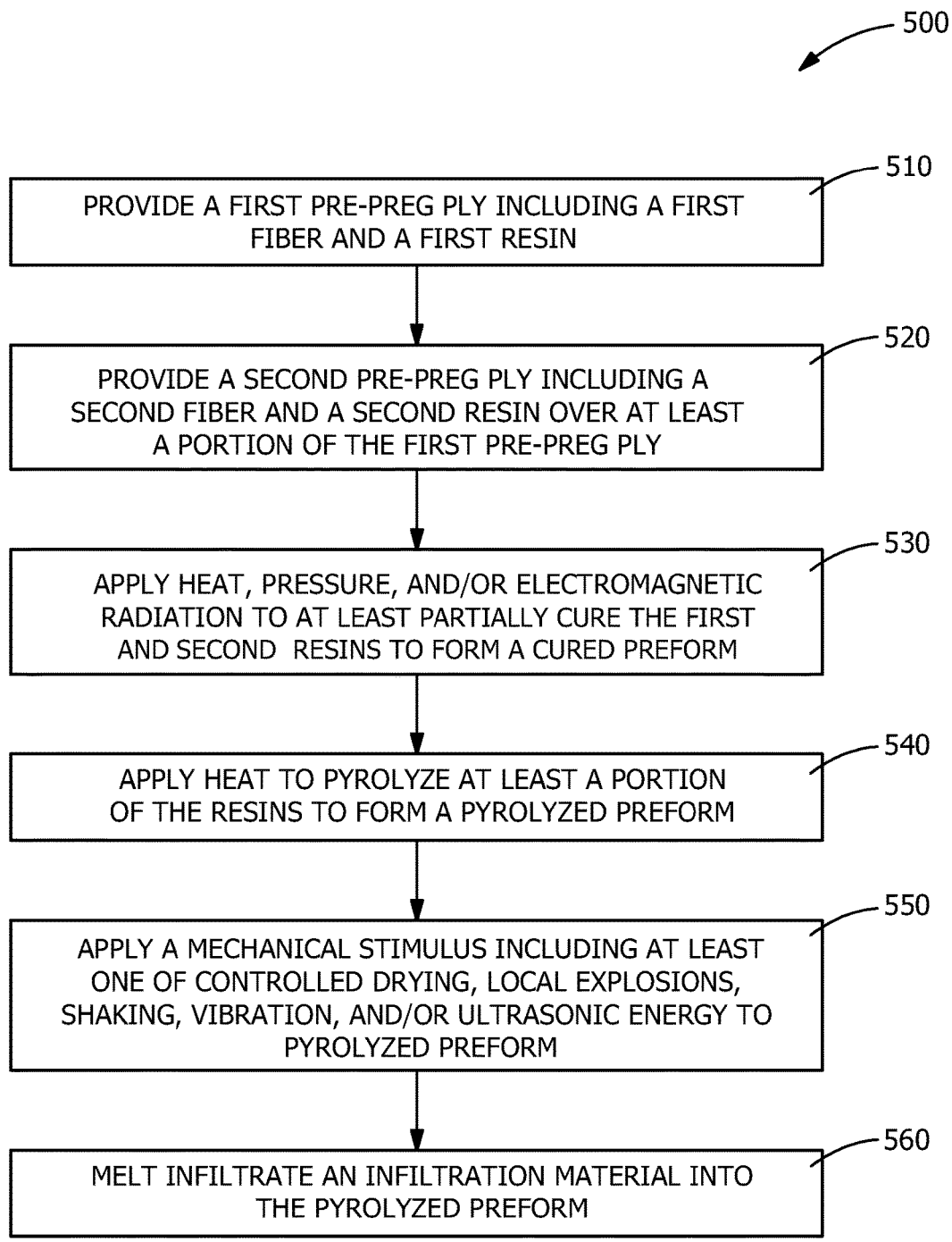
FIG. 6 is a flowchart of a method of making a preform according to an embodiment.

FIG. 6 is a flowchart of a method 500 of making the preform 200. In the example of FIG. 5, at block 510, a first pre-preg ply 110 including a first fiber and a first resin is provided. At block 520, a second pre-preg ply 120 including a second fiber and a second resin is provided over at least a portion of the first pre-preg ply 110. At block 530, heat, pressure, and/or electromagnetic radiation is applied to at least partially cure the first and second resins to form a cured preform 130. At block 540, heat is applied to pyrolyze at least a portion of the resins from the cured preform 130 to form a pyrolyzed preform 140. At block 550, a mechanical stimulus including at least one of controlled drying, local explosions, shaking, vibration, and/or ultrasonic energy is applied to the pyrolyzed preform 140. At block 560, an infiltration material is melt infiltrated into the pyrolyzed preform 140 to form the preform 200.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A method of making a preform, comprising:
   providing a first pre-preg ply including at least a first fiber and a first resin;
   providing a second pre-preg ply including at least a second fiber and a second resin over at least a portion of the first pre-preg ply;
   applying heat or electromagnetic radiation to at least partially cure the first and second resins to form a cured preform;
   applying heat to pyrolyze at least a portion of the resin from the cured preform to form a pyrolyzed preform;
   applying a mechanical stimulus including at least one of local explosions, shaking, vibration, or ultrasonic energy to the pyrolyzed preform to form a mechanically treated pyrolyzed preform; and densifying the mechanically treated pyrolyzed preform with an infiltration material to form a densified preform;

wherein the mechanical stimulus is applied prior to contact with the infiltration material.

2. The method of making a preform of claim 1, wherein the first fiber includes a tow or a roving.

3. The method of making a preform of claim 1, wherein the first fiber and second fiber are independently selected from the group consisting of alumina fiber, carbon fiber, mullite fiber, silicon carbide fiber, and combinations thereof.

4. The method of making a preform of claim 3, wherein the first fiber and the second fiber are the same.

5. The method of making a preform of claim 3, wherein the first fiber and the second fiber include silicon carbide fiber.

6. The method of making a preform of claim 1, wherein the densifying includes a technique selected from the group consisting of chemical vapor infiltration, solution infiltration, slurry infiltration, melt infiltration, sintering, electrophoretic deposition, pre-ceramic powder ceramic precursor pyrolysis, polymer precursor pyrolysis, and combinations thereof.

7. The method of making a preform of claim 6, wherein the densifying includes melt infiltration.

8. The method of making a preform of claim 1, wherein the first pre-preg ply and the second pre-preg ply include at least one of unidirectional filaments, unidirectional tows, or unidirectional rovings.

9. The method of making a preform of claim 1, wherein the first pre-preg ply and the second pre-preg ply are woven.

10. The method of making a preform of claim 9, wherein the first pre-preg ply and the second pre-preg ply are mechanically connected in a three-dimensional weave.

11. The method of making a preform of claim 1, wherein the infiltration material includes silicon.

12. A method of making a preform, comprising:
providing a first ply including at least a first fiber;
providing a second ply including at least a second fiber over at least a portion of the first ply;
impregnating the first ply and the second ply with at least one resin;
applying heat or electromagnetic radiation to at least partially cure the first and second resins to form a cured preform;
applying heat to pyrolyze at least a portion of the resin from the cured preform to form a pyrolyzed preform;
applying a mechanical stimulus including at least one of local explosions, shaking, vibration, or ultrasonic energy to the pyrolyzed preform to form a mechanically treated pyrolyzed preform; and
densifying the mechanically treated pyrolyzed preform with an infiltration material to form a densified preform;
wherein the mechanical stimulus is applied prior to contact with the infiltration material.

13. The method of claim 12, wherein the impregnating the first ply and the second ply includes at least one of resin transfer molding, vacuum assisted resin transfer molding, reaction injection molding, compression molding, or resin film infusion.

14. The method of claim 12, wherein the first ply and second ply include silicon carbide fibers.

15. The method of claim 12, wherein the mechanical stimulus includes ultrasonic energy.

16. The method of claim 12, wherein the densifying includes melt infiltration.

17. The method of claim 12, wherein the infiltration material includes silicon.

18. The method of claim 12, wherein the at least one resin includes furfuryl alcohol.

* * * * *